United States Patent
Ravikumar et al.

(10) Patent No.: US 11,125,815 B2
(45) Date of Patent: Sep. 21, 2021

(54) ELECTRO-OPTIC WAVEFORM ANALYSIS PROCESS

(71) Applicant: Advanced Micro Devices, Inc., Santa Clara, CA (US)

(72) Inventors: Venkat Krishnan Ravikumar, Singapore (SG); Jiann Min Chin, Singapore (SG); Joel Yang Kwang Wei, Singapore (SG); Pey Kin Leong, Singapore (SG)

(73) Assignee: Advanced Micro Devices, Inc., Santa Clara, CA (US)

( * ) Notice: Subject to any disclaimer, the term of this patent is extended or adjusted under 35 U.S.C. 154(b) by 76 days.

(21) Appl. No.: 16/585,963

(22) Filed: Sep. 27, 2019

(65) Prior Publication Data

US 2021/0096174 A1  Apr. 1, 2021

(51) Int. Cl.
*G01R 31/28* (2006.01)
*G01R 31/265* (2006.01)
(Continued)

(52) U.S. Cl.
CPC ......... *G01R 31/2889* (2013.01); *G01R 23/17* (2013.01); *G01R 29/0885* (2013.01)

(58) Field of Classification Search
CPC .... G01R 31/28; G01R 31/265; G01R 31/311; G01R 31/01; G01R 31/3177; G01R 23/17; G01R 29/08
See application file for complete search history.

(56) References Cited

U.S. PATENT DOCUMENTS 6,072,179 A   6/2000 Paniccia et al.
9,651,610 B2  5/2017 Eiles et al.
(Continued)

FOREIGN PATENT DOCUMENTS

KR   101887118 B1   8/2018
WO   2016-099783 A1  6/2016

OTHER PUBLICATIONS

Venkat Krishnan Ravikumar, Winson Lua, Seah Yi Xuan, Gopinath Ranganathan and Angeline Phoa; "Combinational Logic Analysis using Laser Voltage Probing"; White paper; ISTFA 2015; 41st International Symposium for Testing and Failure Analysis; Nov. 1-5, 2015; Portland, OR; United States; 7 pages.

(Continued)

*Primary Examiner* — Neel D Shah
(74) *Attorney, Agent, or Firm* — Polansky & Associates, P.L.L.C.; Paul J. Polansky; Nathan H. Calvert

(57) ABSTRACT

A reconfigurable optic probe is used to measure signals from a device under test. The reconfigurable optic probe is positioned at a target probe location within a cell of the device under test. The cell including a target net to be measured and non-target nets. A test pattern is applied to the cell and a laser probe (LP) waveform is obtained in response. A target net waveform is extracted from the LP waveform by: i) configuring the reconfigurable optic probe to produce a ring-shaped beam having a relatively low-intensity region central to the ring-shaped beam; (ii) re-applying the test pattern to the cell at the target probe location with the relatively low-intensity region applied to the target net and obtaining a cross-talk LP waveform in response; (iii) normalizing the cross-talk LP waveform; and (iv) determining a target net waveform by subtracting the normalized cross-talk LP waveform from the LP waveform.

20 Claims, 6 Drawing Sheets

(51) Int. Cl.
*G01R 31/311* (2006.01)
*G01R 23/17* (2006.01)
*G01R 29/08* (2006.01)

(56) References Cited

U.S. PATENT DOCUMENTS

| | | | |
|---|---|---|---|
| 10,012,692 B2 | 7/2018 | Ross et al. | |
| 2011/0199110 A1* | 8/2011 | Kasapi | G01R 31/308 324/754.22 |
| 2013/0113510 A1 | 5/2013 | Kasapi | |
| 2014/0149811 A1* | 5/2014 | Ross | G01R 31/2882 714/724 |
| 2017/0131349 A1 | 5/2017 | Nemirow et al. | |

OTHER PUBLICATIONS

Eli Abuayob, Evgny Nisenboim, Amir Revah, Baohua Niu and Tom Tong; "Complex Waveform Analysis for Advanced CMOS ICs: Physics of Complex Waveform Signals for Design Validation and Debug Application"; ISTFA 2016; 42nd International Symposium for Testing and Failure Analysis; Nov. 6-10, 2016; Fort Worth, TX; United States; 8 pages.

V.K. Ravikumar, G. Lim, J.M. Chin, K.L. Pey, J.K.W. Yang; "Understanding spatial resolution of laser voltage imaging"; Microelectronics Reliability, 88-90; Elsievier Publication; 2018; pp. 255-261; 7 pages.

Venkat Krishnan Ravikumar, et al.; "Pattern search automation for combinational logic analysis"; Conference Proceedings from the 44th International Symposium for Testing and Failure Analysis; ISTFA 2018; Oct. 28-Nov. 1, 2018; Phoenix, AZ; United States; pp. 86-92; 7 pages.

International Search Report and Written Opinion for International Application No. PCT/US2020/052668, dated Jan. 19, 2021, 8 pages.

* cited by examiner

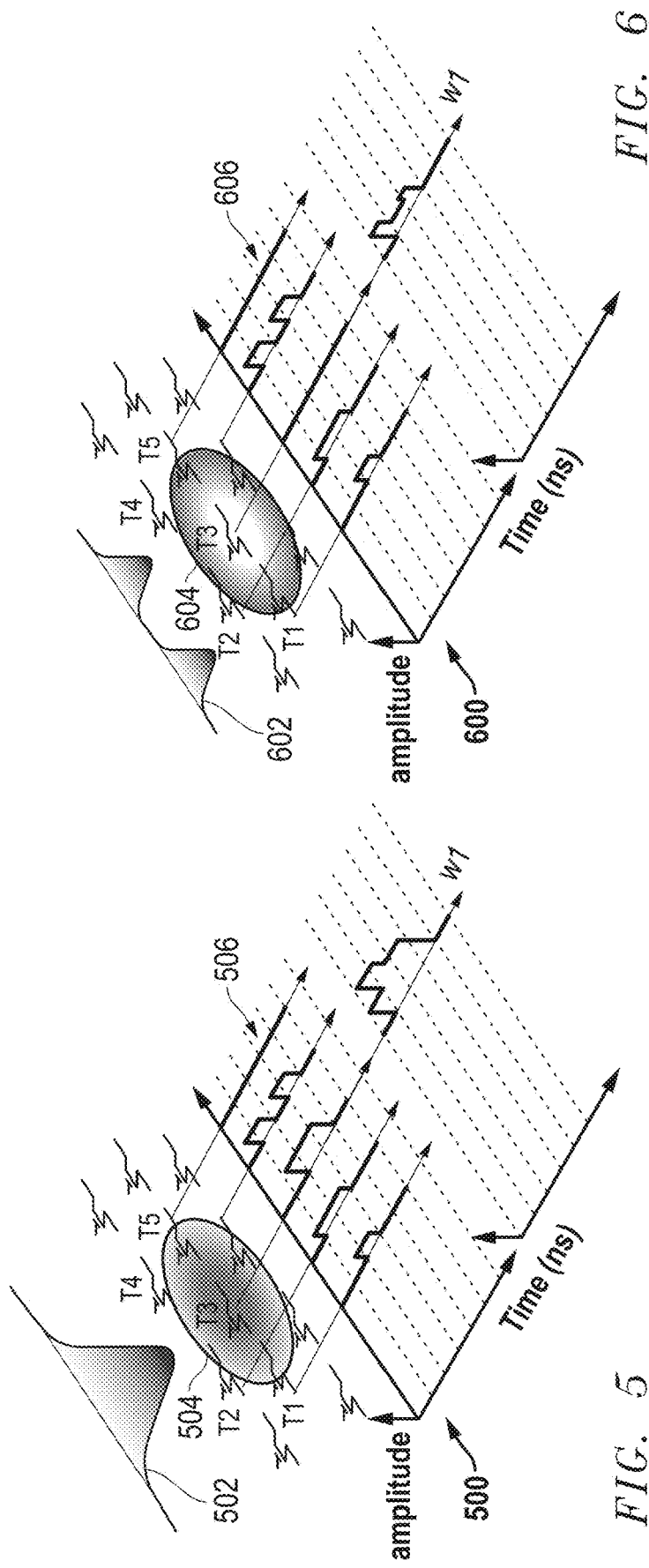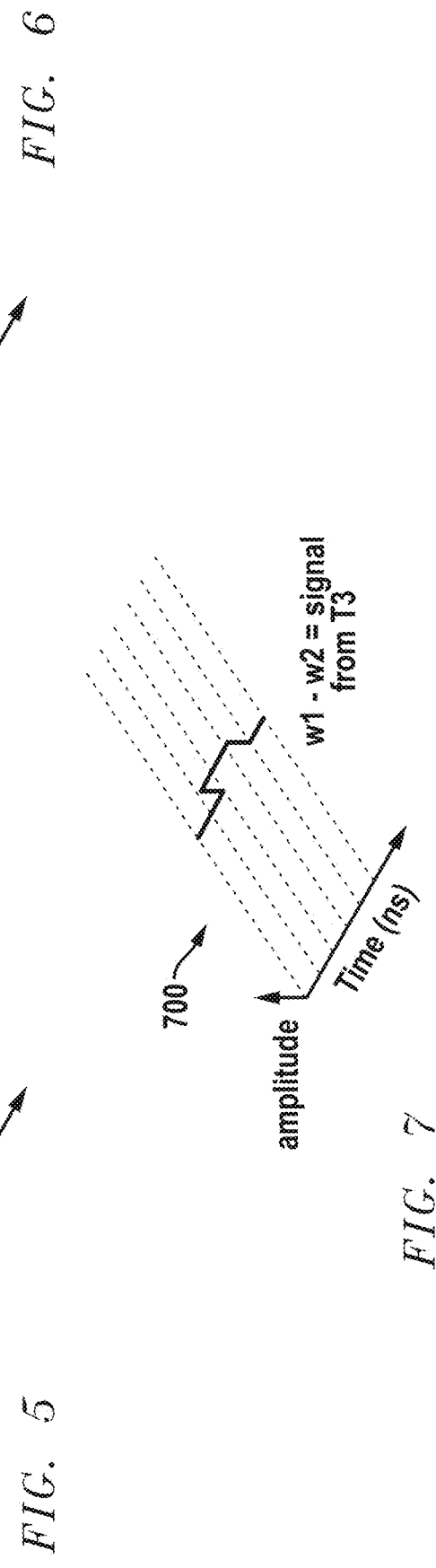
FIG. 5
FIG. 6
FIG. 7

ELECTRO-OPTIC WAVEFORM ANALYSIS PROCESS

CROSS-REFERENCE TO RELATED APPLICATIONS

This application is related to U.S. patent application Ser. No. 16/296,614, filed Mar. 8, 2019, entitled "Probe Placement for Laser Probing System", which is hereby incorporated by reference.

BACKGROUND

Integrated circuits experience circuit failures from a variety of causes. For example, problems in the manufacturing process can result in defects that prevent the circuit from operating properly. Integrated circuits are tested at the manufacturing facility for proper operation before being shipped to customers. However, the integrated circuits can have defects that are not found during manufacturing test due to the inability to test every circuit node in the integrated circuit. Also, the integrated circuit can operate properly at the factory but subsequently fail when placed in a larger product that is sold to an end user. The subsequent failures can be caused by circuit degradation over time, mechanical stresses leading to cracks and voids, and chemical contamination from mobile ions. When a failure occurs, whether due to the manufacturing process, design, reliability, or incorrect usage of the integrated circuit, there is a need to isolate the failure and determine the source of the failure in order to take corrective action.

Integrated circuit engineers typically determine the operation in which the failure occurs and then identify the circuit element that caused the failure. A test program can typically be used to identify the operation. However, isolating the actual failing circuit is much more difficult. Historically, engineers removed passivation covering the chip and placed tiny needles, and subsequently electron beams, on exposed metal to capture signals and compare the captured signals to expected results. However, with the advent of flip-chip technology and as integrated circuit manufacturing technology progressed, circuit features became too small for mechanical probes, leading engineers to adopt laser probing.

With laser probing, also known as optic probing or electro-optic probing, a laser source is focused at a single node of an integrated circuit, and the characteristics of the reflected laser light indicate changes in the voltage of the node over time. Typical laser probing uses visible light or infrared radiation, and the chip is probed from the backside, i.e. the non-active surface. This technique has allowed probing resolution down to about 200 nanometers (nm). However as minimum transistor geometries have shrunk to much smaller sizes such as 16 nm and 14 nm, it has become difficult to discern the operation of a single transistor using laser probing, especially in the vicinity of other active transistors.

One known technique to solve these problems is to probe the integrated circuit die from the backside using shorter wavelength light, such as light in the visible spectrum despite silicon being highly absorptive in the visible spectrum. Though it achieves better resolution, this technique creates other problems. First, it requires the integrated circuit die to be thinned down to below 5 microns (μm) to overcome the losses in signal via absorption in the substrate, making it difficult to analyze failures. This process adds risk of damage caused by thinning the die, and affects the thermal dissipation in the active circuits. Second, because of the reduced wavelength, the light itself can change the behavior of the circuit. Thus, this technique has proved to be inadequate.

BRIEF DESCRIPTION OF THE DRAWINGS

FIG. 5 shows a waveform diagram illustrating an LP waveform acquisition process with a graphical depiction of the source of the waveforms;

FIG. 6 shows a waveform diagram illustrating a cross-talk LP waveform acquisition process with a graphical depiction of the source of the waveforms;

FIG. 7 shows a waveform diagram of a target net waveform based on the waveforms of FIG. 5 and FIG. 6.

Figure 1:
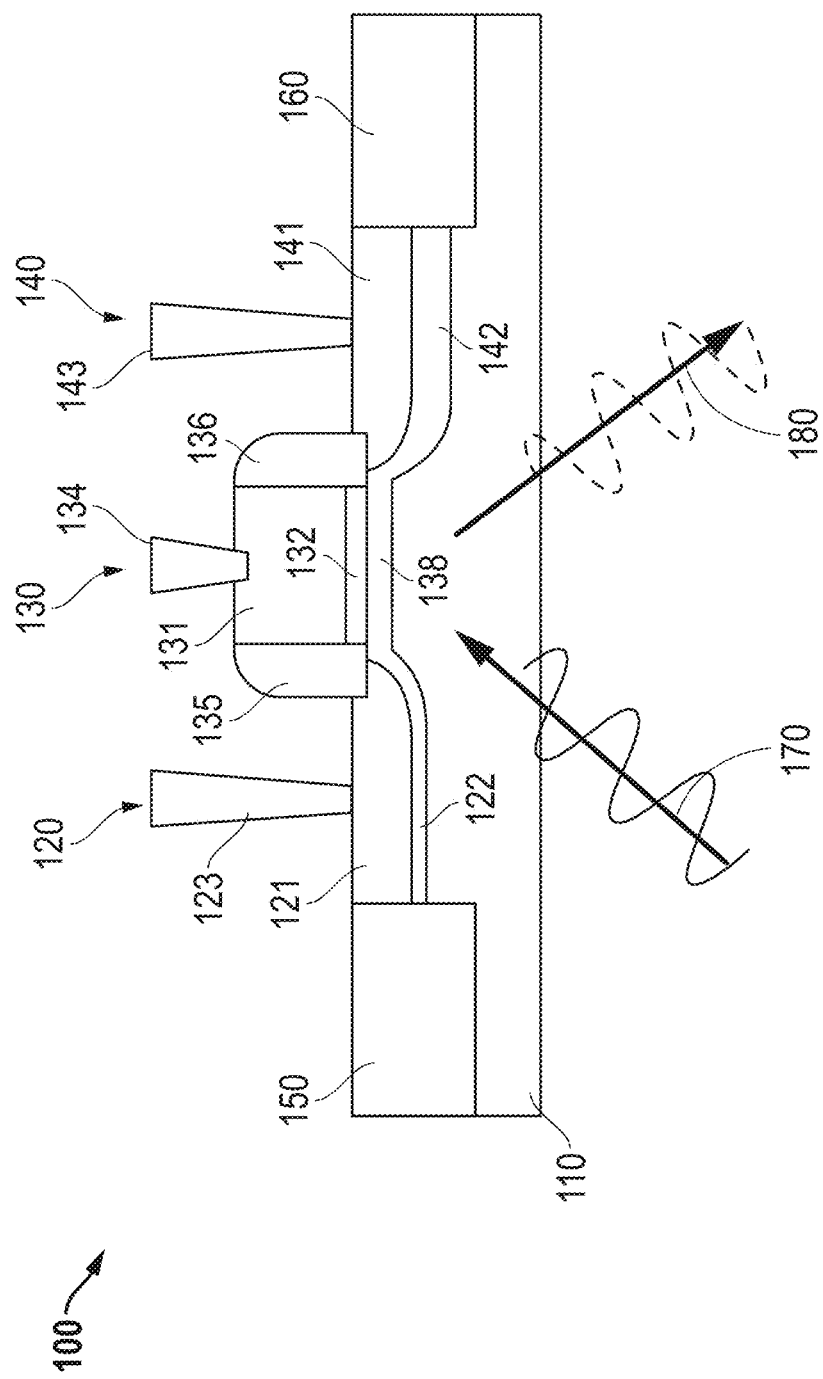
FIG. 1 illustrates a cross section of an integrated circuit being probed using a technique known in the prior art.

In the following description, the use of the same reference numbers in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Also, various components are referred to as "optics" or "optical", but it is to be understood that these names do not imply that the electromagnetic signals are necessarily within the visible range.

DETAILED DESCRIPTION OF ILLUSTRATIVE EMBODIMENTS

A method performs an optic probe test and extracts a target net waveform. The method includes positioning a reconfigurable optic probe at a target probe location within a cell of a device under test, the cell including a target net to be measured and a plurality of non-target nets. A test pattern is applied to the cell with the reconfigurable optic probe at the target probe location and a laser probe (LP) waveform is obtained in response. A target net waveform is extracted from the LP waveform by: (i) configuring the reconfigurable optic probe to produce a ring-shaped beam having a relatively low-intensity region central to the ring-shaped beam; (ii) re-applying the test pattern to the cell at the target probe location with the relatively low-intensity region applied to the target net and obtaining a cross-talk LP waveform in response; (iii) normalizing the cross-talk LP waveform; and (iv) determining a target net waveform by subtracting the normalized cross-talk LP waveform from the LP waveform.

A laser probing system is for laser probing a device under test having a cell. The laser probing system includes a laser source, an optical system, a receiver circuit, and a test controller. The optical system is adapted to provide a reconfigurable optic probe at selectable locations of the device under test in response to light from the laser source, receive reflected light from the device under test, and output the reflected light. The receiver circuit receives the reflected light from the optical system, and provides a laser probe (LP) waveform in response to the reflected light. The test controller includes a first input for receiving the LP waveform, and an output for providing a measurement signal. The test controller causes the reconfigurable optic probe to apply a test pattern to the device under test at a target probe location, triggers the receiver circuit to capture the LP waveform, and causes a target net waveform to be extracted from the LP waveform by (i) configuring the reconfigurable optic probe to produce a ring-shaped beam having a relatively low-intensity region central to the ring-shaped beam; (ii) re-applying the test pattern to the cell at the target probe location with the relatively low-intensity region applied to a target net and obtaining a cross-talk LP waveform in response; (iii) normalizing the cross-talk LP waveform; and (iv) determining a target net waveform by subtracting the normalized cross-talk LP waveform from the LP waveform.

An analysis system for a laser probing system includes a receiver circuit and a test controller. The receiver circuit includes an input for receiving reflected light produced from a reconfigurable optic probe, a control input for receiving a measurement signal, and an output for providing a laser probe (LP) waveform of the reflected light. The test controller includes a first input for receiving the LP waveform and an output for providing a measurement signal. The test controller causes the reconfigurable optic probe to apply a test pattern to a device under test at a target probe location, triggers the receiver circuit to capture the LP waveform, and causes a target net waveform to be extracted from the LP waveform by (i) configuring the reconfigurable optic probe to produce a ring-shaped beam having a relatively low-intensity region central to the ring-shaped beam; (ii) re-applying the test pattern at the target probe location with the relatively low-intensity region applied to a target net and obtaining a cross-talk LP waveform in response; (iii) normalizing the cross-talk LP waveform; and (iv) determining a target net waveform by subtracting the normalized cross-talk LP waveform from the LP waveform.

FIG. 1 illustrates a cross section of an integrated circuit 100 being probed using a technique known in the prior art. As shown in FIG. 1, integrated circuit 100 has a front side containing an active surface oriented on the top and a back side oriented on the bottom. Integrated circuit 100 is formed with a lightly-doped p-type ("p−") substrate 110. The cross section in FIG. 1 shows a portion of integrated circuit 100 having a metal-oxide-semiconductor (MOS) transistor formed with a source portion 120, a gate portion 130, and a drain portion 140. Source portion 120 has a heavily-doped n-type ("n+") diffusion 121 forming the source of the transistor, a free carrier region 122 underlying n+ source region 121, and a metal via 123 that extends upward to a conductor forming a more negative power supply voltage terminal labeled "$V_{SS}$" (not shown in FIG. 2). Gate portion 130 includes a gate 131, a gate dielectric 132, a free carrier region 133, a via 134 that extends upward to a signal conductor (not shown in FIG. 2) that conducts a voltage labeled "+$V_G$", and sidewall portions 135 and 136. Drain portion 140 has an n+ drain diffusion 141 forming the drain of the transistor, a free carrier region 142 underlying n+ drain diffusion 141, and a via 143 to a signal conductor (not shown in FIG. 1) conducting a signal labeled "+$V_D$". Integrated circuit 100 also includes oxide regions 150 and 160 at left and right ends of the transistor. Oxide regions 150 and 160 are high resistance dielectric regions that isolate the source and drain regions of the transistor from surrounding circuitry. FIG. 1 shows oxide regions 150 and 150 as regions formed in substrate 110 such as would be formed by shallow trench isolation (STI), but it should be apparent that the transistor has been formed by just one possible device structure, the n-channel MOS transistor, and other device structures such as a P-channel MOS transistor, a silicon-on-insulator (SOI) transistor, a FINFET, and the like can be analyzed using laser probing as well.

When it is desired to probe the transistor, a laser probing system (not shown in FIG. 1) provides an incident beam of light 170 through the back side of integrated circuit 100 to free carrier region 133 below gate portion 130. As the transistor becomes conductive and non-conductive, the size of free carrier region 133 increases and decreases, amplitude modulating the reflected beam 180. The laser probing system includes a receiver circuit that measures the amplitude of the reflected laser light to determine whether the transistor is conductive at a desired point in time. Moreover the measurement can occur repeatedly to form a histogram by which the laser probing system can reconstruct the electrical signal over a time period of interest.

Figure 2:
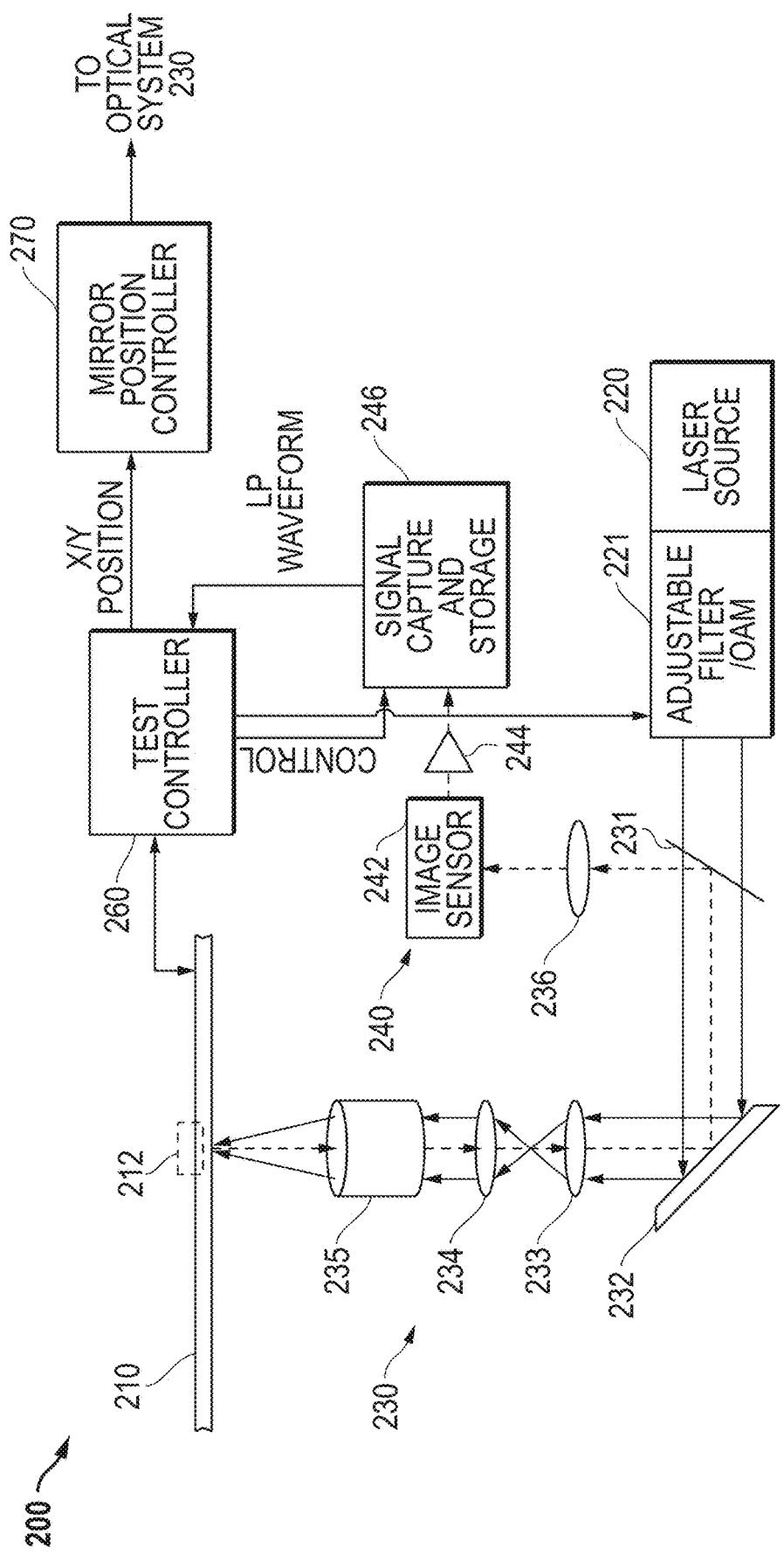
FIG. 2 illustrates in block diagram form a laser probing system according to some embodiments.

FIG. 2 illustrates in block diagram form a laser probing system 200 according to some embodiments. Laser probing system 200 includes generally a device under test 210, a laser source 220, an adjustable filter/optical angular momentum (OAM) modulator 221, an optical system 230, a receiver circuit 240, a test controller 260, and a mirror position controller 270.

Device under test 210 is an integrated circuit that, as shown in FIG. 2, has a front side oriented upward and a back side oriented downward. Device under test 210 also has a cell 212 to be laser probed using a test program applied to input terminals.

Laser source 220 emits an incident beam of coherent laser light at a predetermined frequency. In some embodiments, the incident beam could have a wavelength ($\lambda$) in the infrared region. In particular, the incident beam could have a wavelength in the near-infrared region such as $\lambda=1064$ nm, $\lambda=1122$ nm, $\lambda=1154$ nm, or $\lambda=1319$ nm. In one particular embodiment, the incident beam has a wavelength with a wavelength much closer to the visible range, with $\lambda=785$ nm. In some implementations, the optic probe has a size on a surface of the device under test of 100 nm-300 nm. The adjustable filter/OAM modulator 221 is an optical filter or modulator that alters the beam of laser source 220 to produce a ring-shaped beam pattern, as is further described below. Adjustable filter/OAM modulator 221 adjusts upon command from test controller 260 in a first mode in which the beam of laser source 220 is passed through unchanged from its normal form, and a second mode in which the filter or modulator is active and a ring-shaped beam patter is produced. The adjustment functionality is achieved in any suitable manner. For example, in some embodiments, a filter is moved in and out of the beam path or the beam path is altered to include a filter. In some embodiments, a second laser source configured to modulate the laser light to produce a ring-shaped beam is activated while the unmodified laser source is deactivated.

Optical system 230 includes a beam splitter 231, an X/Y scan mirror 232, a scan lens 233, a tube lens 234, an objective lens 235, and a focus lens 236. Beam splitter 231 has a left surface and a right surface as oriented in FIG. 2. The left surface receives light emitted by laser source 220 and passes the light through beam splitter 231 substantially uninterrupted. The right surface receives light and reflects it upward. X/Y scan mirror 232 reflects light and is controllable to move the position of the emitted and returned light to and from the back side of device under test 210. Scan lens 233, tube lens 234, and objective lens 235 further condition the incident laser light on the back side of device under test 210 that has been steered to the desired position by controlling X/Y scan mirror 232. The incident radiation interacts with circuitry in cell 212 and forms a reflected beam according to the electrical state of cell 212. The reflected light passes through objective lens 235, tube lens 234, and scan lens 233, and is directed by X/Y scan mirror 232 and beam splitter 231 through focus lens 236 to receiver circuit 240 for detection.

Receiver circuit 240 includes an image sensor 242, a buffer 244, and a signal capture and storage block 246. Image sensor receives the incident radiation from focus lens 236, and provides an electrical signal in response. Buffer 244 re-drives the electrical signal to prevent distortion of the output of image sensor 242. Signal capture and storage block 246 has a first input connected to the output of buffer 244, a second input for receiving a control signal labeled "CONTROL", and an output for providing a signal labeled "LP WAVEFORM". In this way, receiver circuit 240 converts the reflected light from optical system 230 to electrical signal LP WAVEFORM.

Test controller 260 has a first input for receiving the LP WAVEFORM, a first output for providing the CONTROL signal, a second output connected to device under test 210 for providing the test pattern and receiving output signals provided by device under test 210 in response to the test pattern, and a third output for providing a position signal labeled "X/Y POSITION".

Mirror position controller 270 has an input connected to the third output of test controller 260 for receiving the X/Y POSITION signal, and an output connected to optical system 230. For example, the output provided to optical system 230 could be voltages that change to position of X/Y scan mirror 232 to adjust the focused incident beam to another location relative to cell 212, or to another location in device under test 210, indicated by the X/Y POSITION, In operation, optical system 230 receives the incident radiation emitted by laser source 220, focuses it on a back side of device under test 210, and receives reflected radiation that is altered by the interaction of the incident radiation and active nodes in cell 212. Image sensor 242 is a photosensor array that receives the reflected light and provides an electrical signal in response. In general, the electrical signal is proportional to the amount of reflected radiation received at pixels in image sensor 242. Signal capture and storage block 246 forms a histogram of waveform intensities over a period of time initiated by the CONTROL signal. Test controller 260 provide the CONTROL signal at a selected point in the execution of the test pattern. For example, if device under test 210 is a data processor, then test controller 260 runs a test pattern to determine that the failure occurs during the execution of a certain instruction executed.

One of the problems with the extremely small geometries is that the LP waveform often includes a lot of cross-talk signals from other nets in the vicinity of the target net. A target net is the electrical network in the device under test that is currently desired to measured. Other nets that are not currently desired to be measured are referred to as non-target nets. Test controller 260 operates to extract a target net waveform from the LP waveform as further described below.

Figure 3:
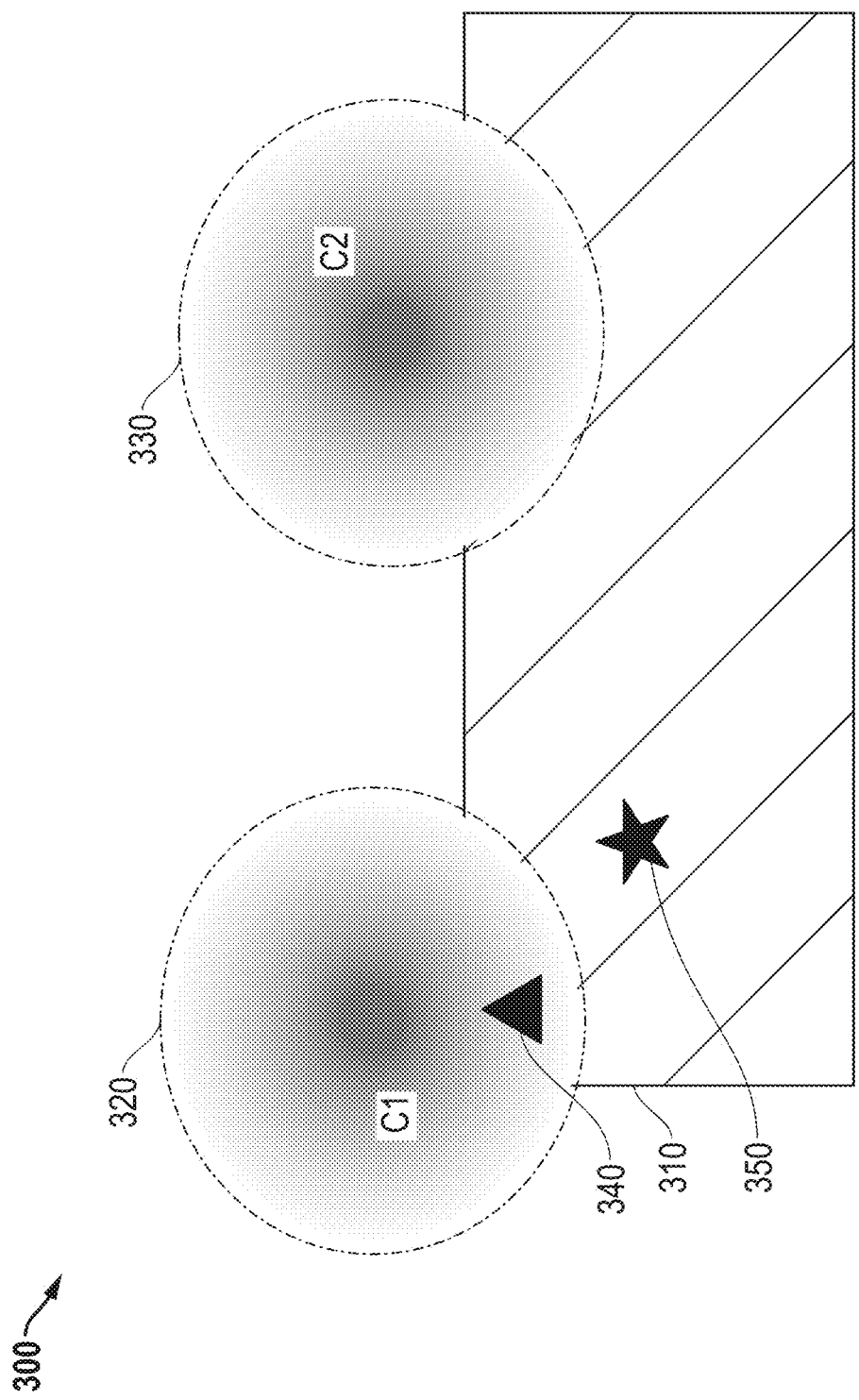
FIG. 3 illustrates a backside view of a portion of an integrated circuit 300 with cross-talking devices.

FIG. 3 illustrates a backside view of a portion of an integrated circuit 300 with cross-talking devices. Integrated circuit 300 includes a cell of interest 310 and two cross-talking devices C1 and C2, in which C1 produces significant cross-talk in area 320 and C2 produces significant cross-talk in area 330. The area of cell 310 includes two potential probe points 340 and 350. If probing occurs at probe point 340, then cross-talking device C1 affects the measured LP waveform because probe point 340 is in area 320. If probing occurs at probe point 350, however, then cross-talking devices C1 and C2 do not significantly affect the measured LP waveform because probe point 350 is neither in area 320 or area 330.

The area of cell 310 is such that that in 14 nm technology, the laser probe, even if properly positioned, measures the activity of multiple surrounding transistors. For example, with 14 nm technology, the contacted poly pitch (CPP) of a transistor is about 78 nm, and the laser probe capture the activity of approximately 6-9 transistors. Moreover, for an integrated circuit manufactured with even smaller 7 nm technology, the CPP drops to about 55 nm. Thus, as transistor size decreases, extracting a target net signal from cross-talk signals becomes even more important.

Figure 4:
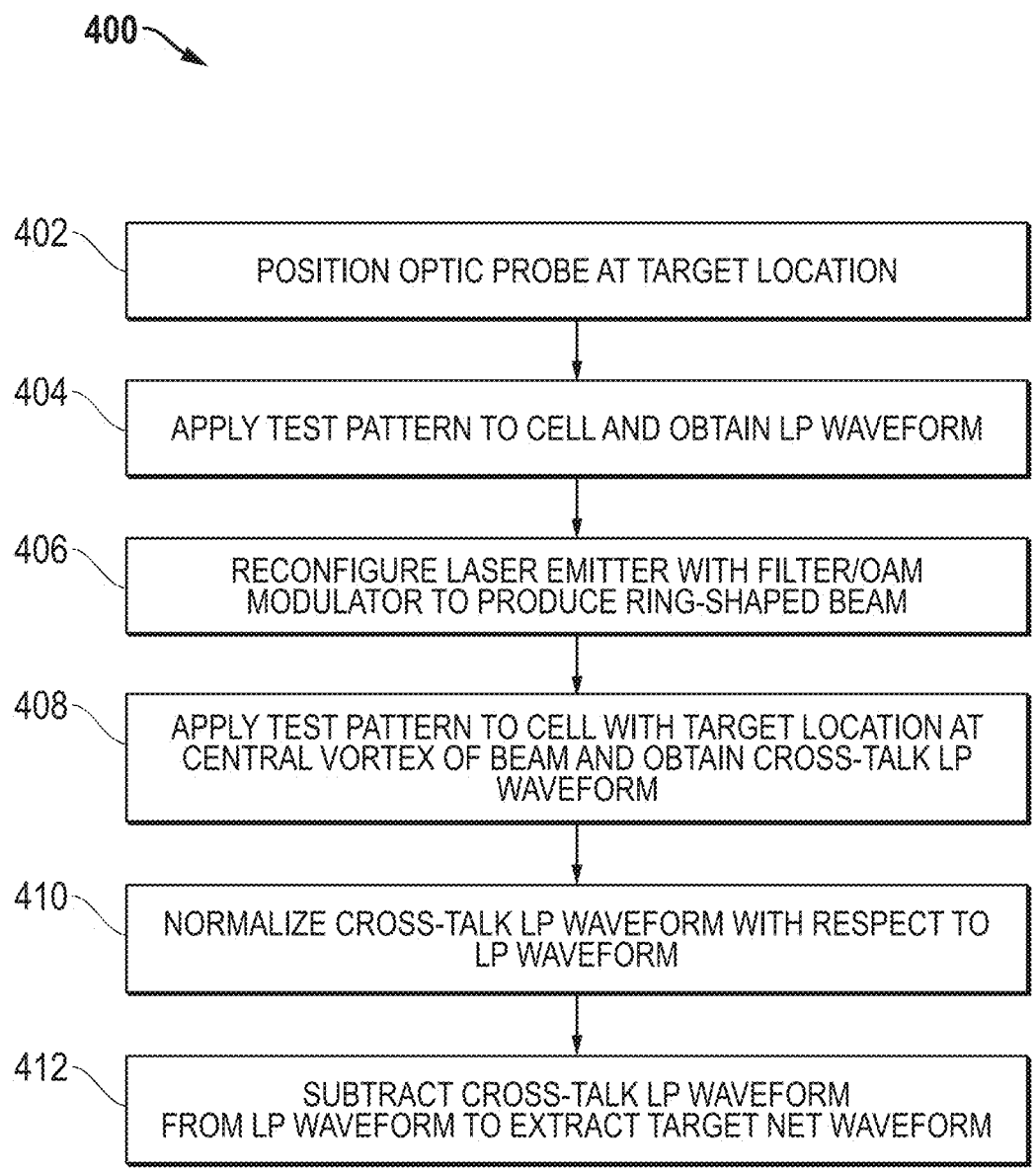
FIG. 4 shows a flow diagram of a laser probe measurement process performed with the laser probing system of FIG. 2 according to some embodiments.

FIG. 4 shows a flow diagram 400 of a laser probe measurement process performed with the laser probing system of FIG. 2 according to some embodiments. Flow diagram 400 starts with block 402, which positions the optic probe at a target location, typically directed at a target net within a particular selected cell of the device under test. At block 404, a test pattern is applied to the cell with the optic probe at the target probe location, and a laser probe (LP) waveform is obtained in response to the target pattern. The LP waveform includes cross-talk resulting from non-target nets that fall within the area of the optic probe, as discussed above.

The method extracts the target net waveform from the LP waveform to obtain a more accurate measurement of the target net. To perform such extraction, at block 406 the optic probe is reconfigured to produce a ring-shaped beam having a relatively low-intensity region central to the ring-shaped beam. This reconfiguration is typically done by adjusting a filter or OAM modulator, as further described below. In other embodiments, the adjustment is implemented in other ways such as by reconfiguring the optic probe to work with a second laser source that includes the desired beam shape. Next, at block 408, the test pattern is re-applied to the cell at the target probe location with the relatively low-intensity region applied to the target net. A cross-talk LP waveform is obtained in response to the test pattern.

At block 410, the cross-talk LP waveform is normalized with respect to the LP waveform obtained at block 404. This normalization scales the signal level of the cross-talk LP waveform to be similar to the signal level of the cross-talk signals present in the LP waveform. In some embodiments, a normalization is not needed if the optic probe has a similar magnitude before and after the reconfiguration of block 406. Next at block 412, the process determines the target net waveform by subtracting the normalized cross-talk LP waveform from the LP waveform.

FIGS. 5-7 are a sequence of diagrams illustrating the process of FIG. 4. FIG. 5 shows a waveform diagram 500 illustrating an LP waveform acquisition process with a graphical depiction of the source of the waveforms. An optic probe beam 502 is shown in its initial form, before the optic probe is reconfigured, and is used in acquiring the initial LP waveform (block 404, FIG. 4). The beam is depicted as impinging on a number of transistor devices T1, T2, T3, T4, and T5, shown in stylized diagram form, at a circular area 504 of an exposed surface of a device under test. The cross-sectional intensity of optic probe beam 502 is depicted by its shape, with a higher intensity in the center of circular area 504 dropping off to a lower intensity toward the edges of circular area 504. The transistor terminals or other nets within circular area 504 each contribute to the signal measured by the optic probe as a test pattern is applied to the device under test, as indicated by the arrows linking individual transistors to contributing waveforms 506. These contributing waveforms 506 represent the contribution of the devices to the overall measured LP waveform w1, which represents an addition of contributing waveforms 506. When a particular target net signal is desired to be measured, such as a signal at a terminal of transistor T3, the other contributing waveforms are cross-talk waveforms because they are part of the measured LP waveform, and therefore interfere with proper measurement of the target net signal.

FIG. 6 shows a waveform diagram 600 of a cross-talk LP waveform acquisition process with a graphical depiction of the source of the waveforms. To extract the desired target net waveform from waveform w1, a cross-talk waveform is measured. A ring-shaped beam 602 from the optic probe is shown to illustrate the form of the optic probe beam after the optic probe is reconfigured to acquire the cross-talk LP waveform (block 406, FIG. 4). Ring-shaped beam 602 is depicted as impinging on a number of transistor devices in a ring-shaped area 604 at the device under test. The cross-sectional intensity of ring-shaped beam 602 is depicted by its shape, with a relatively low-intensity area in the center of ringed-shaped area 604, surrounded by a ring of higher optical intensity. The relatively low-intensity area is positioned at a target net, in this example at a terminal of transistor T3. As a result, the contributing waveform shown resulting from transistor T3 in FIG. 5, which is the target net waveform in this example, is not present in contributing waveforms 606. Instead, as the test pattern is applied to the device under test, and the cross-talk LP waveform w2 is acquired, the target net does not contribute to waveform w2, while the other contributing waveforms, which are cross-talk waveforms, are present in contributing waveforms 606.

FIG. 7 shows a waveform diagram 700 of a target net waveform based on the waveforms of FIG. 5 and FIG. 6. To create the target net waveform, the process subtracts a normalized version of cross-talk waveform w2 from LP waveform w1 (block 412, FIG. 4), resulting in the depicted target net waveform containing only the signal resulting from the target net at transistor T3.

Figure 8:
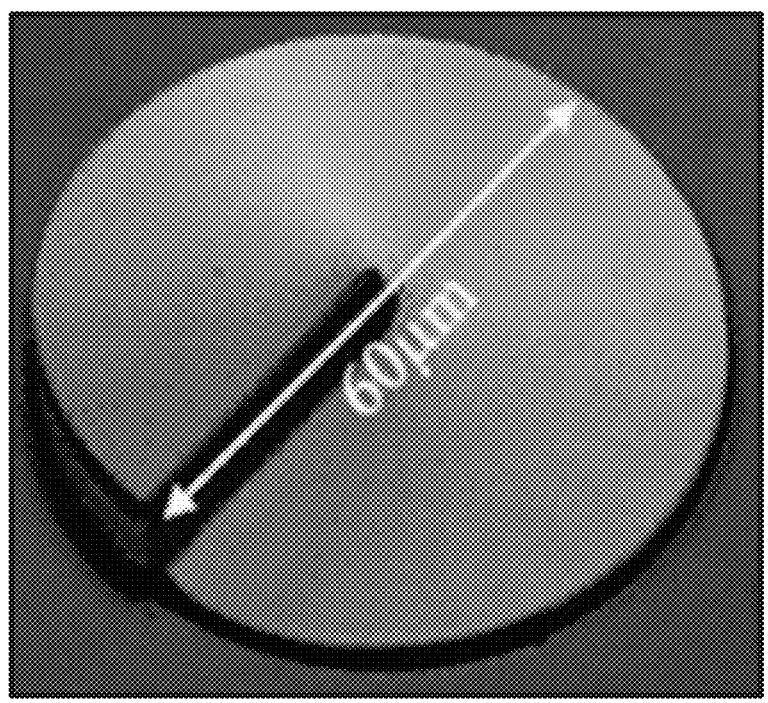
FIG. 8 illustrates in a perspective view a spiral phase plate optical angular momentum (OAM) modulator according to some embodiments.

FIG. 8 illustrates in a perspective view an optical angular momentum (OAM) modulator 800 according to some embodiments. The depicted OAM modulator 800 is a spiral phase plate (SPP) constructed of an optically transparent material and having a thickness varying linearly with the azimuth angle around the plate. This varying thickness causes an incident beam from a laser source to experience an azimuthally dependent phase change, thereby creating a helical wavefront with a relatively low intensity region or an optical vortex at its center. While a diameter of 60 μm is depicted in this embodiment, the size often varies in different applications. OAM modulator 800 is moved into optic probe beam path to provide the adjustment. OAM modulator 800 is an exemplary implementation of an adjustable filter/OAM modulator 221 (FIG. 2) used to adjust laser source 220 to provide a reconfigurable optic probe able to produce a normal optic probe beam and a ring shaped beam like that of FIG. 6. While an SPP is shown, this is merely one example and different filters, spatial modulators, or OAM modulators are used in various embodiments to provide an adjustable laser source. Examples of such devices include nano waveguide arrays, fork metagrating, spiral metasurface holograms, orthogonal nanoslit metasurfaces, and geometric phases metasurfaces. In some embodiments, the ring-shaped beam has a radius of approximately 200 nm and the relatively low-intensity region has a radius of approximately 70 nm. In other embodiments, the beam radius varies between approximately 100 nm to 300 nm, with the low-intensity region varying in size under approximately 90 nm. While an optical vortex of zero intensity preferred in the middle of the ring-shaped beam, a relatively low-intensity area with a non-zero intensity is suitable in some embodiments. Preferably, the relatively low-intensity region is smaller than a Gaussian spread of the reconfigurable optic probe.

In some embodiments, some or all of the system elements illustrated in FIG. 2 are governed by instructions that are stored in a computer readable storage medium and that are executed by at least one processor. In such embodiments, each of the process blocks shown in FIG. 4 correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:

1. A method of performing an optic probe test, comprising:
    positioning a reconfigurable optic probe at a target probe location within a cell of a device under test, the cell including a target net to be measured and a plurality of non-target nets;
    applying a test pattern to the cell with the reconfigurable optic probe at the target probe location and obtaining a laser probe (LP) waveform in response; and
    extracting a target net waveform from the LP waveform by:
        (i) configuring the reconfigurable optic probe to produce a ring-shaped beam having a relatively low-intensity region central to the ring-shaped beam;
        (ii) re-applying the test pattern to the cell at the target probe location with the relatively low-intensity region applied to the target net and obtaining a cross-talk LP waveform in response;
        (iii) normalizing the cross-talk LP waveform; and
        (iv) determining a target net waveform by subtracting the normalized cross-talk LP waveform from the LP waveform.

2. The method of claim 1, wherein the relatively low-intensity region includes an optical vortex.

3. The method of claim 1, wherein the relatively low-intensity region is smaller than a Gaussian spread of the reconfigurable optic probe.

4. The method of claim 1, wherein configuring the reconfigurable optic probe to produce the ring-shaped beam includes applying a filter to a laser emitter of the reconfigurable optic probe.

5. The method of claim 1, wherein the ring-shaped beam is produced by a spatial light modulation.

6. The method of claim 5, wherein the spatial light modulation is produced by an orbital angular momentum (OAM) modulator.

7. The method of claim 1, wherein the ring-shaped beam has a radius of approximately 200 nm and the relatively low-intensity region has a radius of approximately 70 nm.

8. The method of claim 1, wherein:
the reconfigurable optic probe has a size on a surface of the device under test of approximately 200 nanometers (nm); and
the device under test is a semiconductor integrated circuit having transistors whose gate lengths are less than 20 nm.

9. A laser probing system for laser probing a device under test having a cell, comprising:
a laser source;
an optical system adapted to provide a reconfigurable optic probe at selectable locations of the device under test in response to light from the laser source, receive reflected light from the device under test, and output the reflected light;
a receiver circuit that receives the reflected light from the optical system, and provides a laser probe (LP) waveform in response to the reflected light;
a test controller having a first input for receiving the LP waveform, and an output for providing a measurement signal, wherein the test controller causes the reconfigurable optic probe to apply a test pattern to the device under test at a target probe location, triggers the receiver circuit to capture the LP waveform, and causes a target net waveform to be extracted from the LP waveform by (i) configuring the reconfigurable optic probe to produce a ring-shaped beam having a relatively low-intensity region central to the ring-shaped beam; (ii) re-applying the test pattern to the cell at the target probe location with the relatively low-intensity region applied to a target net and obtaining a cross-talk LP waveform in response; (iii) normalizing the cross-talk LP waveform; and (iv) determining a target net waveform by subtracting the normalized cross-talk LP waveform from the LP waveform.

10. The laser probing system of claim 9, wherein the relatively low-intensity region includes an optical vortex.

11. The laser probing system of claim 9, wherein the relatively low-intensity region is smaller than a Gaussian spread of the reconfigurable optic probe.

12. The laser probing system of claim 9, wherein configuring the reconfigurable optic probe to produce the ring-shaped beam includes applying a filter to the laser source.

13. The laser probing system of claim 9, wherein the ring-shaped beam is produced by a spatial light modulation.

14. The laser probing system of claim 13, wherein the spatial light modulation is produced by an orbital angular momentum (OAM) modulator.

15. The laser probing system of claim 9, wherein the ring-shaped beam has a radius of approximately 200 nm and the relatively low-intensity region has a radius of approximately 70 nm.

16. The laser probing system of claim 9, wherein:
the reconfigurable optic probe has a size on a surface of the device under test of 100 nm-300 nm nanometers (nm); and
the device under test is a semiconductor integrated circuit having transistors whose gate lengths are less than 20 nm.

17. An analysis system for a laser probing system, comprising:
a receiver circuit having an input for receiving reflected light produced from a reconfigurable optic probe, a control input for receiving a measurement signal, and an output for providing a laser probe (LP) waveform of the reflected light; and
a test controller having a first input for receiving the LP waveform, and an output for providing a measurement signal, wherein the test controller causes the reconfigurable optic probe to apply a test pattern to a device under test at a target probe location, triggers the receiver circuit to capture the LP waveform, and causes a target net waveform to be extracted from the LP waveform by (i) configuring the reconfigurable optic probe to produce a ring-shaped beam having a relatively low-intensity region central to the ring-shaped beam; (ii) re-applying the test pattern at the target probe location with the relatively low-intensity region applied to a target net and obtaining a cross-talk LP waveform in response; (iii) normalizing the cross-talk LP waveform; and (iv) determining a target net waveform by subtracting the normalized cross-talk LP waveform from the LP waveform.

18. The analysis system of claim 17, wherein configuring the reconfigurable optic probe to produce the ring-shaped beam includes causing a filter to be applied to a laser emitter of the reconfigurable optic probe.

19. The analysis system of claim 17, wherein configuring the reconfigurable optic probe to produce the ring-shaped beam includes causing a spatial modulator to be applied to a laser emitter of the reconfigurable optic probe.

20. The analysis system of claim 19, wherein the spatial modulator is an orbital angular momentum (OAM) modulator.

* * * * *